United States Patent
Yuan

(10) Patent No.: US 11,703,615 B2
(45) Date of Patent: Jul. 18, 2023

(54) MID-INFRARED LENS AND MANUFACTURING METHOD THEREOF

(71) Applicants: Chih-Wei Yuan, Tainan (TW); Kuo-Tai Huang, Shuishang Township (TW)

(72) Inventor: Chi-Chou Yuan, Tainan (TW)

(73) Assignees: Chih-Wei Yuan, Tainan (TW); Kuo-Tai Huang, Chiayi County (TW)

( * ) Notice: Subject to any disclaimer, the term of this patent is extended or adjusted under 35 U.S.C. 154(b) by 118 days.

(21) Appl. No.: 17/212,357

(22) Filed: Mar. 25, 2021

(65) Prior Publication Data
US 2021/0356630 A1    Nov. 18, 2021

(30) Foreign Application Priority Data
May 13, 2020 (TW) .................... 109115893

(51) Int. Cl.
   *B05D 1/18*      (2006.01)
   *G02B 3/04*      (2006.01)
   *G02B 1/10*      (2015.01)
   *B05D 3/02*      (2006.01)
   *G02C 7/02*      (2006.01)

(52) U.S. Cl.
   CPC ............. *G02B 3/04* (2013.01); *B05D 1/18* (2013.01); *B05D 3/0263* (2013.01); *G02B 1/10* (2013.01); *G02C 7/02* (2013.01)

(58) Field of Classification Search
CPC ....... B05D 1/18; B05D 3/0263; B05D 3/0227
See application file for complete search history.

(56) References Cited

U.S. PATENT DOCUMENTS

| 2006/0003094 | A1* | 1/2006 | Arai | G02B 1/11 |
| | | | | 427/377 |
| 2017/0023706 | A1* | 1/2017 | Yang | G06F 1/1628 |
| 2019/0219842 | A1* | 7/2019 | Ogo | G02C 7/088 |

\* cited by examiner

*Primary Examiner* — Hai Y Zhang
(74) *Attorney, Agent, or Firm* — Rosenberg, Klein & Lee

(57) ABSTRACT

The present invention relates to a manufacturing method for a mid-infrared lens, which includes the following steps: placing a lens in the path of a far-infrared radiation source, enabling the lens to receive the far infrared rays; immersing the lens in a hardening liquid, causing the hardening liquid to coat the lens, wherein the hardening liquid is an intermixture of silicone and isopropanol or an intermixture of silicone and methanol, and a far-infrared material or a far-infrared composite material is additionally added to the hardening liquid; placing the lens coated with the hardening liquid in a drying space to dry, causing the hardening liquid to dry and harden and form a hardened layer on the surface of the lens. The temperature of the drying space lies between 80 and 120° C., and the drying time lies between 1 and 10 hours.

13 Claims, 10 Drawing Sheets

---

Place a lens and a first far-infrared radiation source together in an operating space.

↓

Immerse the lens in a hardening liquid, causing the hardening liquid to coat the lens.

↓

Place the lens in a drying space, enabling the hardening liquid to dry and harden and form a hardened layer on the lens surface.

↓

Evaporation deposit a plurality of thin film layers of different refractive index on the hardened layer.

```
┌─────────────────────────────────────────────┐
│ Place a lens and a first far-infrared radiation source │
│ together in an operating space.             │
└─────────────────────────────────────────────┘
                      │
                      ▼
┌─────────────────────────────────────────────┐
│ Immerse the lens in a hardening liquid, causing the │
│ hardening liquid to coat the lens.          │
└─────────────────────────────────────────────┘
                      │
                      ▼
┌─────────────────────────────────────────────┐
│ Place the lens in a drying space, enabling the │
│ hardening liquid to dry and harden and form a │
│ hardened layer on the lens surface.         │
└─────────────────────────────────────────────┘
                      │
                      ▼
┌─────────────────────────────────────────────┐
│ Evaporation deposit a plurality of thin film layers │
│ of different refractive index on the hardened layer. │
└─────────────────────────────────────────────┘
```

FIG. 1

MID-INFRARED LENS AND MANUFACTURING METHOD THEREOF

BACKGROUND OF THE INVENTION

(a) Field of the Invention

The present invention relates to a mid-infrared lens and manufacturing method thereof.

(b) Description of the Prior Art

According to the ISO20473 classification, the wavelength of near infrared radiation is between 0.78 to 3 µm (micrometers), the wavelength of mid-infrared radiation is between 3 to 50 µm (micrometers), and the wavelength of far-infrared radiation is between 50 to 1000 µm (micrometers); wherein mid-infrared radiation with a wavelength between 4 to 14 µm can resonate with the molecules of the human body, which facilitates blood vessel dilatation to enable unhindered blood circulation, aids metabolism, and further increases the body's immunity. This wavelength range of infrared is known as the "growth ray" range. Presently, there are a number of spectacles provided with a far-infrared effect on the market; however, the far-infrared effect of the spectacles is unable to directly effect the eyeballs. In addition, the wavelength effect of far-infrared is inferior to that of mid-infrared.

Taiwan Patent No. 1293287 describes a "Manufacturing method for infrared radiating lens", which discloses a far-infrared radiating mixture of high molecular polymer plastics, including ceramic powder, a dispersant agent, a plasticizer, and plastic PET (polyethylene terephthalate) granules, which are thoroughly mixed together in a melted state, after which the liquid mixture containing the far-infrared material is injected into a mold, and the finished lens product is produced after releasing from the mold. Moreover, the finished lens product, having undergone uniform mixing and injection molding, is provided with a long lasting, permanent far-infrared radiating function.

Although the manufacturing method of the above-described patent directly produces a lens provided with a far-infrared radiating effect, however, during the manufacturing process, because of an uneven dispersal of the ceramic powder and the plastic granules, there is the possibility of producing lenses with a poor far-infrared or mid-infrared radiating effect, or have poor lens transparency.

SUMMARY OF THE INVENTION

The present invention provides a manufacturing method for a mid-infrared lens, which includes placing a lens and a first far-infrared radiation source together in an operating space, and carrying out heating at a temperature between 40 and 115° C., the heating time is between 1 and 3 hours, enabling the lens to receive far-infrared rays; immersing the lens in a hardening liquid, causing the hardening liquid to coat the lens while controlling the coating thickness to between 1 and 3 micrometers, wherein the hardening liquid is an intermixture of silicone and isopropanol or an intermixture of silicone and methanol, moreover, a far-infrared material or a far-infrared composite material is added to the hardening liquid, and the far-infrared composite material is a mixture of a far-infrared material and zinc oxide (ZnO); placing the lens coated with the hardening liquid in a drying space to dry, causing the hardening liquid to dry and harden to form a hardened layer on the surface of the lens, wherein the temperature of the drying space lies between 80 and 120° C., and the drying time is between 1 and 10 hours.

The present invention further discloses a mid-infrared lens manufactured using the above-described method.

Preferably, the far-infrared material is any one of the chemicals listed below: magnesium oxide (MgO), calcium oxide (CaO), barium oxide (BaO), zirconium dioxide ($ZrO_2$), titanium dioxide ($TiO_2$), chromic oxide ($Cr_2O_3$), manganese dioxide ($MnO_2$), iron oxide ($Fe_2O_3$), aluminum oxide ($Al_2O_3$), a carbide, a silicide, a boride, a nitride, tantalum (Ta), molybdenum (Mo), tungsten (W), iron (Fe), nickel (Ni), platinum (Pt), copper (Cu), or gold (Au). And the solid weight content of silicone in the hardening liquid lies between 19% and 35%.

Preferably, a progressive heating-up procedure of the lens receiving far-infrared rays from the first far-infrared radiation source gradually raises the temperature from 40 to 115° C. during a heating time of 1 to 3 hours. In a stage heating procedure to raise the temperature from a low temperature to a high temperature, each stage of temperature rise is maintained for a period of time.

Preferably, a direct heating-up procedure of the lens receiving far-infrared rays from the first far-infrared radiation source directly raises the temperature from 40 to 115° C. during a heating time of 1 to 3 hours. The temperature is directly raised from a low temperature to a high temperature, and the highest temperature is maintained for a period of time.

Preferably, a plurality of the first far-infrared radiation sources are placed in the operating space around the lens.

Preferably, a second far-infrared radiation source is placed in the drying space, enabling the lens to receive far infrared rays emitted by the second far-infrared radiation source during the drying process.

Preferably, evaporation deposition is carried out on the hardened layer, wherein the evaporation deposition includes: evaporation depositing a first refractive index thin film layer and evaporation depositing a second refractive index thin film layer on the first refractive index thin film layer, wherein the operating process involving evaporation depositing the first refractive index thin film layer and the second refractive index thin film layer is successively carried out once or a number of times; finally again evaporation depositing the first refractive index thin film layer on the topmost second refractive index thin film layer. The refractive index of the first refractive index thin film layer is lower than the refractive index of the second refractive index thin film layer.

Preferably, the refractive index of the first refractive index thin film layer lies between 1.46 and 1.98, and the refractive index of the second refractive index thin film layer lies between 2.15 and 2.76.

Preferably, the first refractive index thin film layer is one of the following: a silicon oxide thin film layer, a silicon dioxide thin film layer, or a composite thin film layer of silicon oxide and a silicon dioxide. The second refractive index thin film layer is one of the following: a zirconium dioxide thin film layer, a titanium dioxide thin film layer, a dititanium trioxide thin film layer, or a trititanium pentoxide thin film layer.

Preferably, an indium tin oxide thin film layer is evaporation deposited between the first refractive index thin film layer and the second refractive index thin film layer.

Preferably, before evaporation depositing the first refractive index thin film layer and the second refractive index thin film layer on the hardened layer, the evaporation depositing target material and the first far-infrared radiation source are placed together in the operating space, and heated at a temperature between 40 and 115° C. The heating time is between 1 and 3 hours, enabling the target material to receive the far-infrared rays.

Preferably, the weight proportion of the far-infrared material or the far-infrared composite material in the hardening liquid lies between 1% and 5%.

Preferably, the weight proportion of the zinc oxide (ZnO) in the far-infrared composite material lies between 20% and 40%.

The above-described technical characteristics preferably have the following advantages:

1. The preferred embodiment of the present invention adopts the method of placing the lens in far-infrared radiation sources, providing the lens with the function to release mid-infrared rays, which are used to assist blood circulation in the eyes.

2. The preferred embodiment of the present invention adopts the method of coating the lens with a hardening liquid, and a far-infrared material or a far-infrared composite material is added to the hardening liquid, which after drying, the hardened layer contains the far-infrared material, enabling prolonging the period of time the lens can release mid-infrared rays.

3. The preferred embodiment of the present invention evaporation deposits a first refractive index thin film layers, a second refractive index thin film layers, and an indium tin oxide thin film layer on the hardened layer, and uses the plurality of thin film layers to block harmful light radiation, including blue light and infrared radiation, and absorbs reflected ultraviolet radiation, thus achieving the function to protect the user's eyes.

To enable a further understanding of said objectives, structures, characteristics, and effects, as well as the technology and methods used in the present invention and effects achieved, a brief description of the drawings is provided below followed by a detailed description of the preferred embodiments.

BRIEF DESCRIPTION OF THE DRAWINGS

FIG. 1 is a flow chart of the manufacturing method for a mid-infrared lens according to an embodiment of the present invention.

DETAILED DESCRIPTION OF THE PREFERRED EMBODIMENTS

Figure 2:
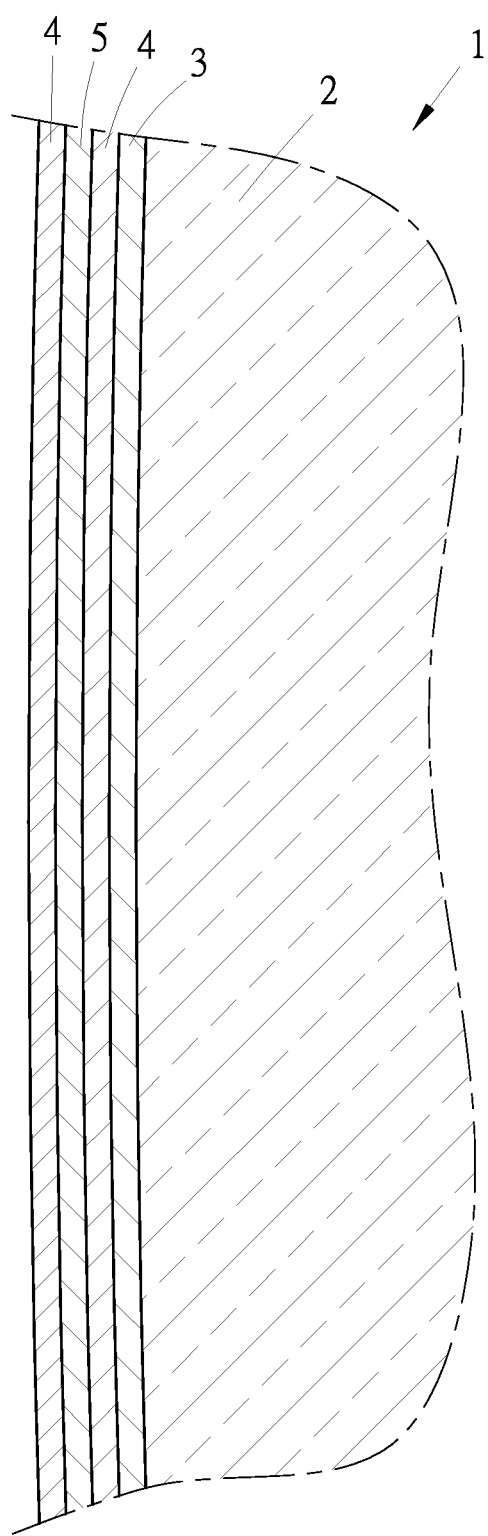
FIG. 2 is a structural schematic view of a hardened layer of the mid-infrared lens successively evaporation deposited with a first refractive index thin film layer, a second refractive index thin film layer, and the first refractive index thin film layer according to the embodiment of the present invention.
Figure 8:
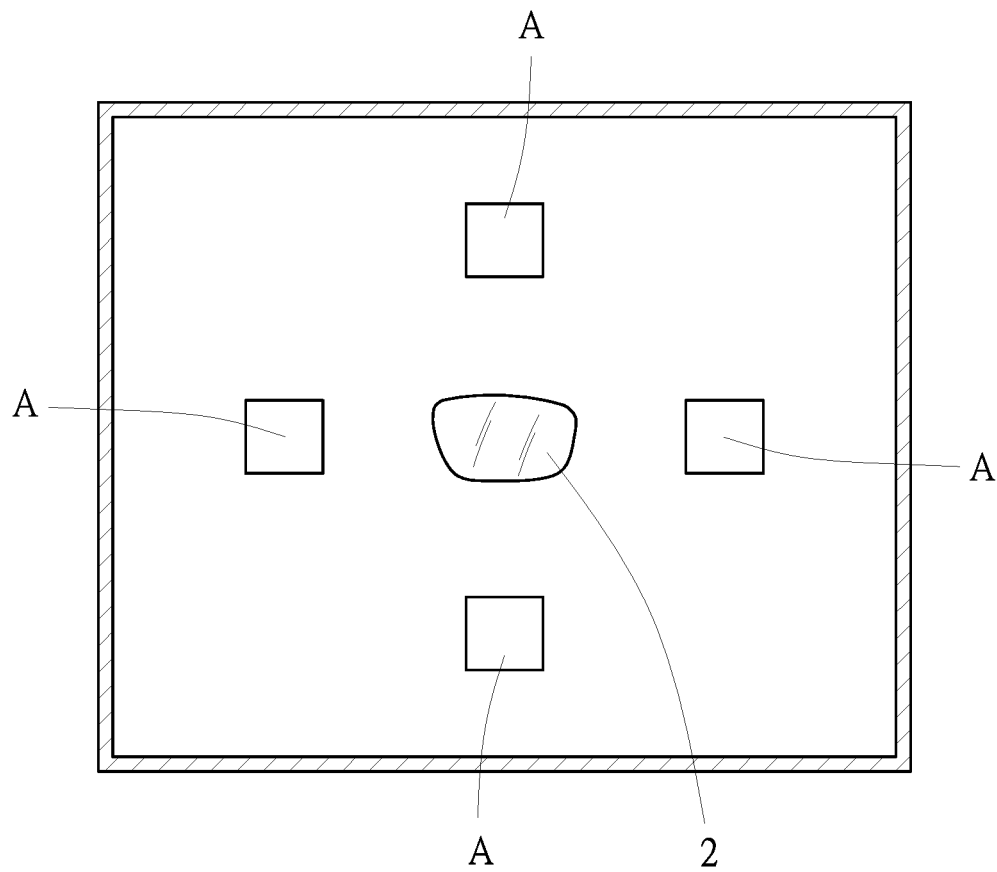
FIG. 8 is a schematic view showing a lens placed in an operating space surrounded by a plurality of far-infrared radiation sources during the manufacturing method according to the embodiment of the present invention.

Referring to FIGS. 1 and 2, which show a flow chart for a manufacturing method for a mid-infrared lens and a mid-infrared lens 1 produced using the manufacturing method, respectively, wherein the manufacturing method for the mid-infrared lens 1 is as follows: placing a lens 2 and a first far-infrared radiation source A together in an operating space, and carrying out heating thereon at a temperature between 40 to 115° C.; the heating time is between 1 to 3 hours, enabling the lens 2 to receive far-infrared rays. The lens 2 can be repeatedly placed in the operating space to carry out repeated heating thereon and enable the lens 2 to repeatedly receive the far-infrared rays. An embodiment of the manufacturing method of the present embodiment also comprises disposing a plurality of the far-infrared radiation sources A in the operating space to surround the lens 2 (as shown in FIG. 8). The lens 2 is then immersed in a hardening liquid, causing the hardening liquid to coat the lens 2. The hardening liquid comprises an intermixture of 19 to 33 parts by weight of silicone and 62 to 76 parts by weight of isopropanol, or an intermixture of 19 to 33 parts by weight of silicone and 62 to 76 parts by weight of methanol. Moreover, a far-infrared material or a far-infrared composite material is added to the hardening liquid, wherein the far-infrared composite material is a mixture of a far-infrared material and zinc oxide (ZnO). The weight proportion of the far-infrared material or the far-infrared composite material in the hardening liquid lies between 1% and 5%; the weight proportion of the zinc oxide (ZnO) in the far-infrared composite material lies between 20% and 40% (for example 30%). The far-infrared material is any one of the substances listed below: magnesium oxide (MgO), calcium oxide (CaO), barium oxide (BaO), zirconium dioxide ($ZrO_2$), titanium dioxide ($TiO_2$), chromic oxide ($Cr_2O_3$), manganese dioxide ($MnO_2$), iron oxide ($Fe_2O_3$), aluminum oxide ($Al_2O_3$), a carbide, a silicide, a boride, a nitride, tantalum (Ta), molybdenum (Mo), tungsten (W), iron (Fe), nickel (Ni), platinum (Pt), copper (Cu), or gold (Au). And the solid weight content of silicone in the hardening liquid lies between 19% and 35%. The lens 2 coated with the hardening liquid is then placed in a drying space to dry, causing the hardening liquid to dry and harden and form a hardened layer 3 on the surface of the lens 2. The temperature of the drying space lies between 80 and 120° C., and the drying time lies between 1 and 10 hours; the thickness of the hardened layer 3 lies between 1 and 3 micrometers. The mid-infrared lens 1 is thus produced. Further, a second far-infrared radiation source can be disposed inside the drying space.

A progressive heating-up procedure of the lens 1 receiving far-infrared rays from the first far-infrared radiation source A gradually raises the temperature from 40 to 115° C. during a heating time of 1 to 3 hours. Two heating-up procedures can be used, including a stage heating procedure can be used to raise the temperature from a low temperature to a high temperature, wherein each stage of temperature rise is maintained for a period of time, or the temperature is directly raised from a low temperature to a high temperature, and the highest temperature is maintained for a period of time. For example, in the stage heating procedure, while raising the temperature to 115° C., the temperature is maintained for 10 minutes for each temperature rise of 10° C. until the temperature has reached 115 C; and in the direct temperature rise method, when it is desired to raise the temperature to 115° C., the temperature is directly raised to 115° C., and then the temperature is maintained at 115° C. for 1 to 3 hours. The above-described two temperature rise procedure embodiments are only the preferred embodiments of the present invention, and do not limit the spirit and scope of the embodiments of the invention. Accordingly, simple equivalent changes and modifications made to the claims as set forth in the present invention and the specification contents are all within the scope covered in the present invention.

Figure 3:
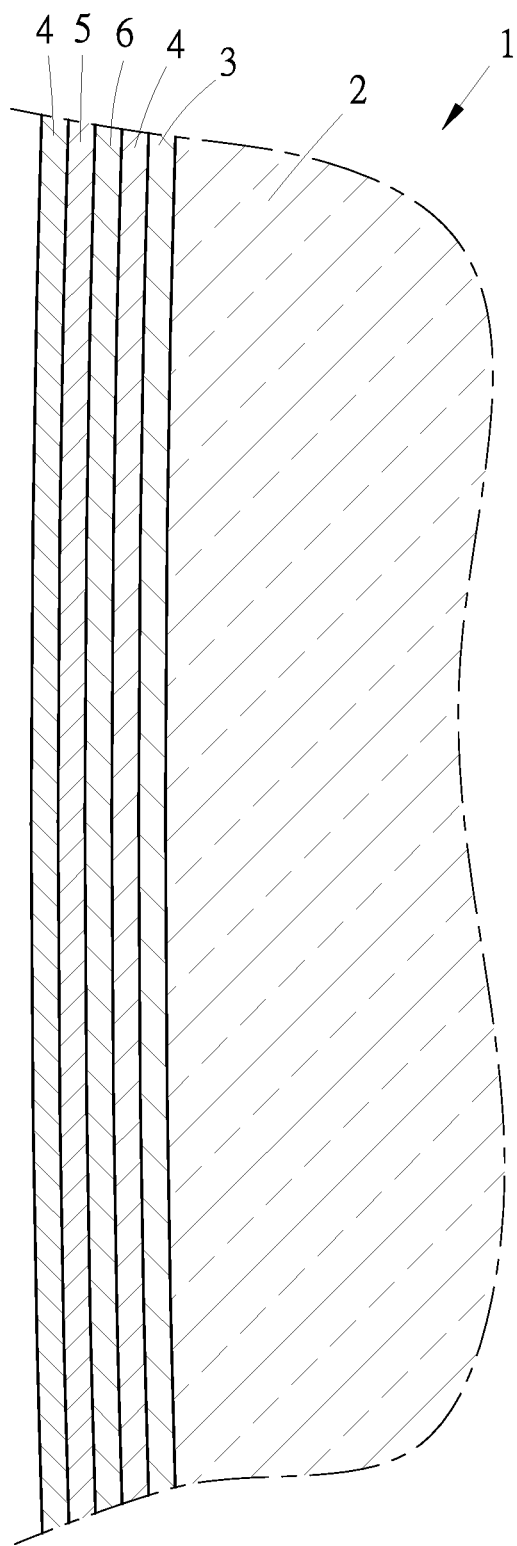
FIG. 3 is a structural schematic view of the hardened layer of the mid-infrared lens successively evaporation deposited with the first refractive index thin film layer, an indium tin oxide thin film layer, the second refractive index thin film layer, and the first refractive index thin film layer according to the embodiment of the present invention.
Figure 4:
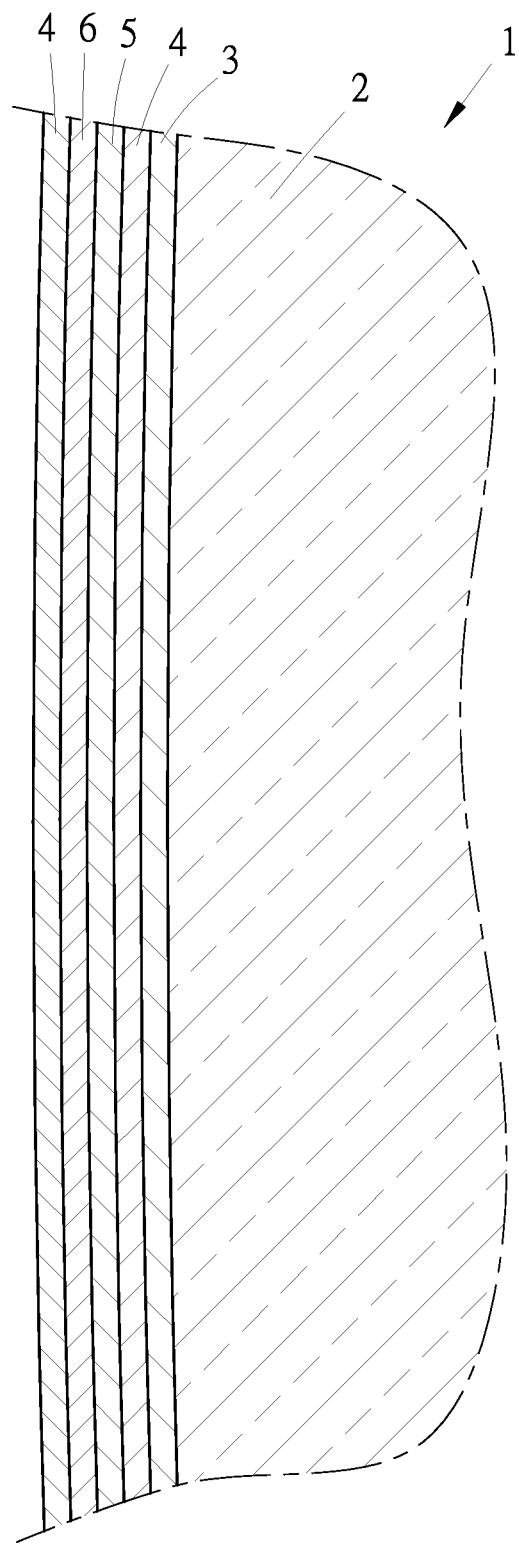
FIG. 4 is a structural schematic view of the hardened layer of the mid-infrared lens successively evaporation deposited with the first refractive index thin film layer, the second refractive index thin film layer, the indium tin oxide thin film layer, and the first refractive index thin film layer according to the embodiment of the present invention.

Referring to FIGS. 2 to 4, evaporation deposition steps are further carried out on the hardened layer 3 of the surface of the mid-infrared lens 1, whereby evaporation depositing of a plurality of thin film layers is achieved. The plurality of thin film layers comprise a first refractive index thin film layer 4 and a second refractive index thin film layer 5, wherein the refractive index of the first refractive index thin film layer 4 is lower than the refractive index of the second refractive index thin film layer 5. The target material of the first refractive index thin film layer 4 is one of the following: a silicon oxide thin film layer, a silicon dioxide thin film layer, or a composite thin film layer of silicon oxide and silicon dioxide. And preferably the refractive index of the first refractive index thin film layer 4 lies between 1.46 and 1.98. The target material of the second refractive index thin film layer 5 is one of the following: a zirconium dioxide thin film layer, a titanium dioxide thin film layer, a dititanium trioxide thin film layer, or a trititanium pentoxide thin film layer. And preferably the refractive index of the second refractive index thin film layer 5 lies between 2.15 and 2.76.

Using three evaporation deposited thin film layers as an example, the evaporation deposition steps comprise: first evaporation depositing the first refractive index thin film layer 4 on the hardened layer 3, then evaporation depositing the second refractive index thin film layer 5 on the first refractive index thin film layer 4, finally again evaporation depositing the first refractive index thin film layer 4 on the second refractive index thin film layer 5. Using five evaporation deposited thin film layers as an example, the evaporation deposition steps comprise: successively evaporation depositing the first refractive index thin film layer 4, the second refractive index thin film layer 5, the first refractive index thin film layer 4, and the second refractive index thin film layer 5 on the hardened layer 3, then finally again evaporation depositing the first refractive index thin film layer 4 on the topmost second refractive index thin film layer 5. Using seven evaporation deposited thin film layers as an example, the evaporation deposition steps comprise: successively evaporation depositing the first refractive index thin film layer 4, the second refractive index thin film layer 5, the first refractive index thin film layer 4, the second refractive index thin film layer 5, the first refractive index thin film layer 4, and the second refractive index thin film layer 5 on the hardened layer 3; finally again evaporation depositing the first refractive index thin film layer 4 on the topmost second refractive index thin film layer 5. In other words, before the final evaporation deposition of the first refractive index thin film layer 4, evaporation deposition of the first refractive index thin film layers 4 and the second refractive index thin film layers 5 can be carried out once or a number of times. Preferably, an indium tin oxide thin film layer 6 is evaporation deposited between the first refractive index thin film layer 4 and the second refractive index thin film layer 5.

Before carrying out the above-described evaporation deposition steps, the target material can be directly used for evaporation deposition, but it is also feasible to place the target material and the first far-infrared radiation source A together in the operating space to carry out heating procedure before the target material is used for evaporation deposition. The heating temperature is between 40 and 115° C., and the heating time is between 1 and 3 hours, thereby enabling the target material to receive far-infrared rays, after which the target material can be used for evaporation deposition.

Referring to FIG. 2, which shows the first refractive index thin film layer 4, the second refractive index thin film layer 5, and the first refractive index thin film layer 4 successively evaporation deposited on the hardened layer 3 of the lens 2. Referring to FIG. 3 and FIG. 4, which show the indium tin oxide thin film layer 6 evaporation deposited between the first refractive index thin film layer 4 and the second refractive index thin film layer 5 and between the second refractive index thin film layer 5 and the first refractive index thin film layer 4, respectively.

Figure 5:
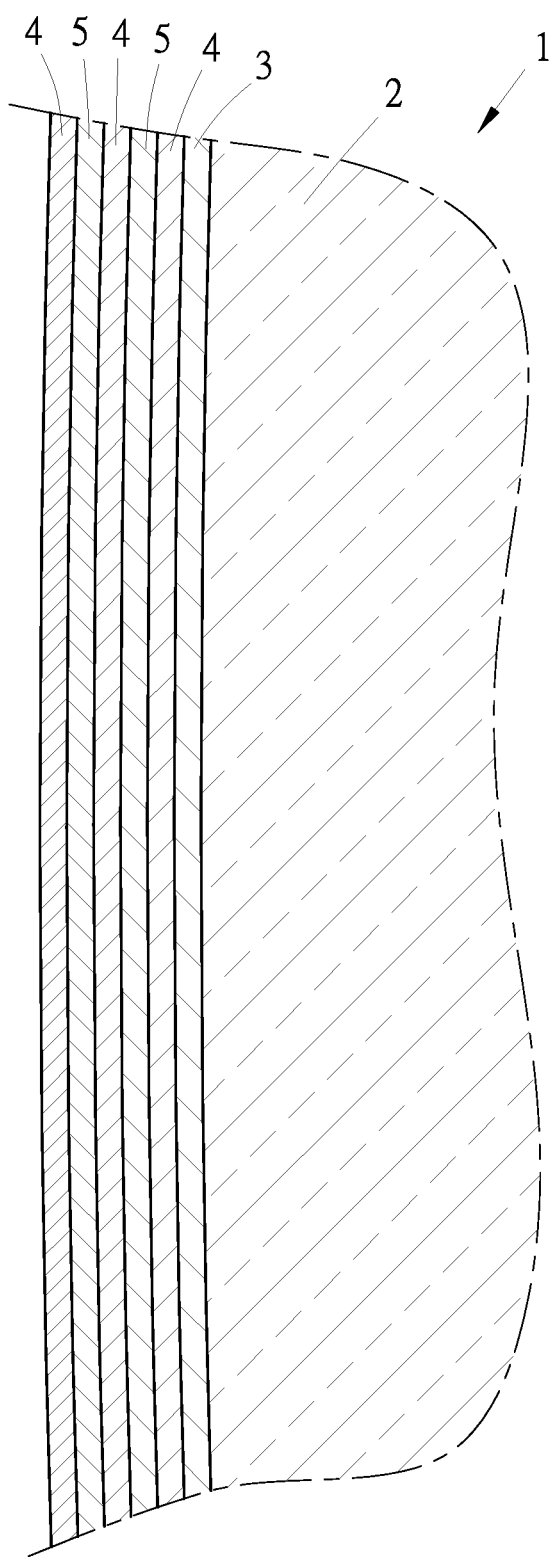
FIG. 5 is a structural schematic view of the hardened layer of the mid-infrared lens successively evaporation deposited with the first refractive index thin film layer, the second refractive index thin film layer, the first refractive index thin film layer, the second refractive index thin film layer, and the first refractive index thin film layer according to the embodiment of the present invention.
Figure 6:
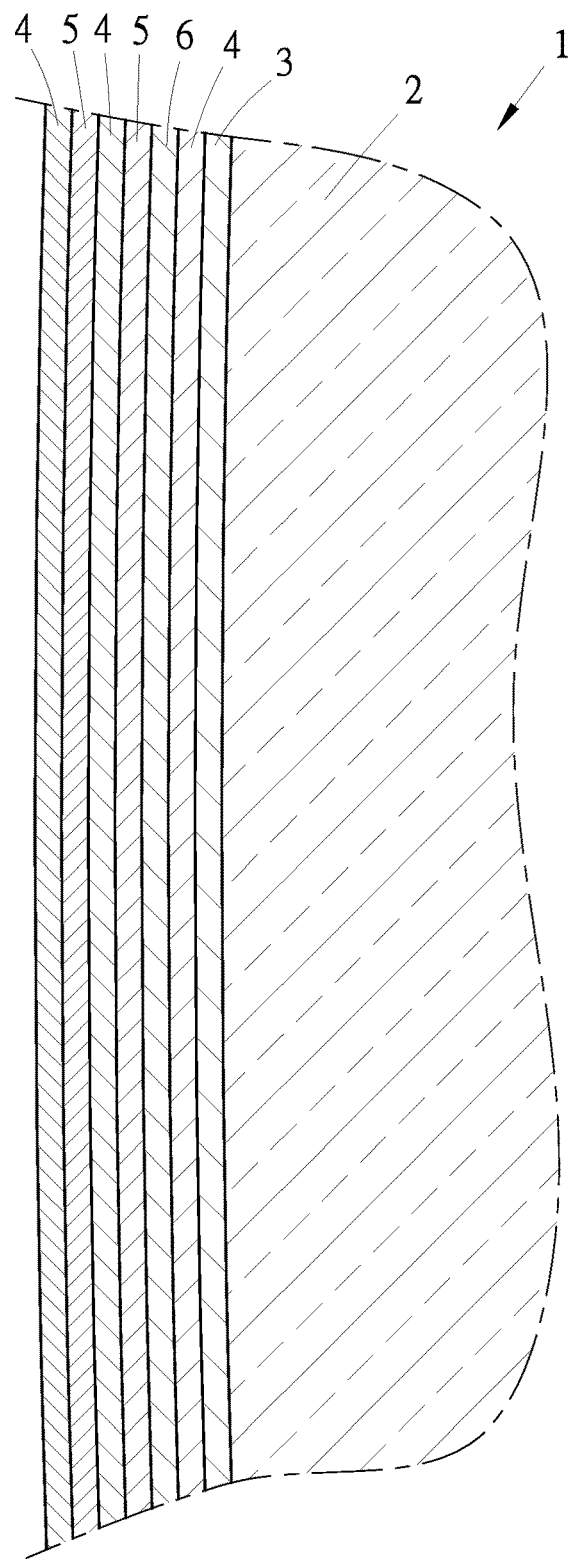
FIG. 6 is a structural schematic view of the hardened layer of the mid-infrared lens successively evaporation deposited with the first refractive index thin film layer, the indium tin oxide thin film layer, the second refractive index thin film layer, the first refractive index thin film layer, the second refractive index thin film layer, and the first refractive index thin film layer according to the embodiment of the present invention.
Figure 7:
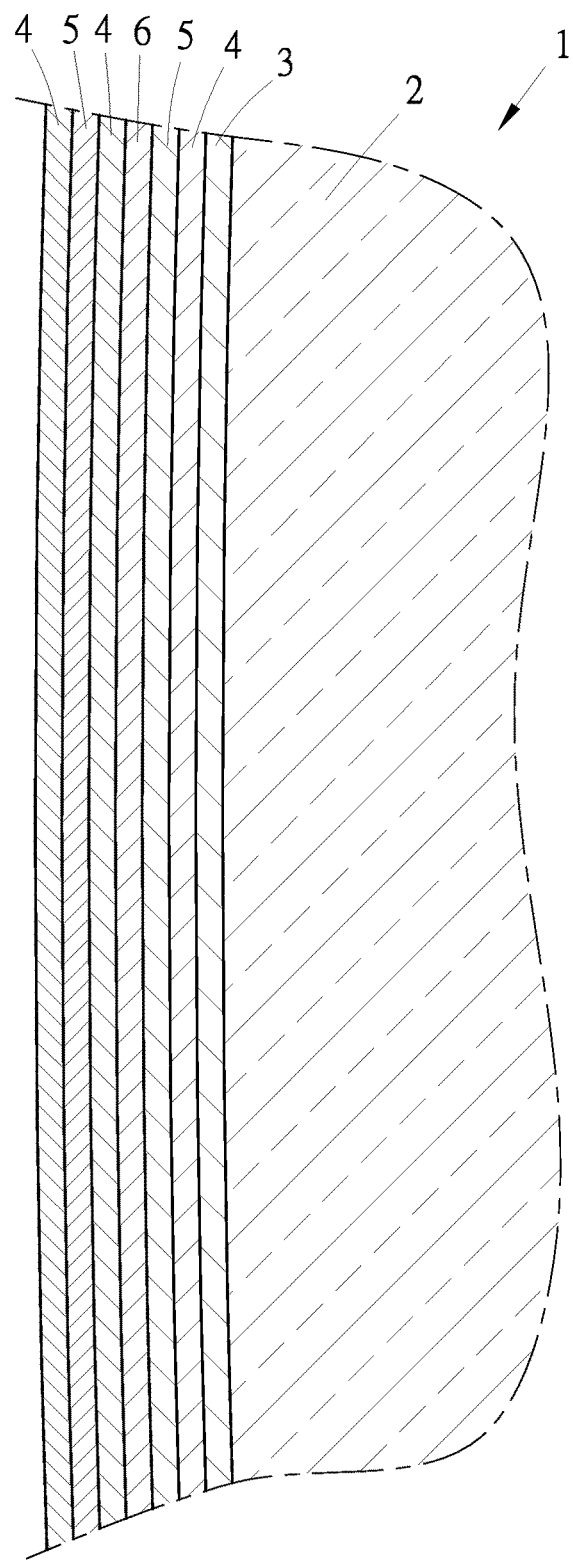
FIG. 7 is a structural schematic view of the hardened layer of the mid-infrared lens successively evaporation deposited with the first refractive index thin film layer, the second refractive index thin film layer, the indium tin oxide thin film layer, the first refractive index thin film layer, the second refractive index thin film layer, and the first refractive index thin film layer according to the embodiment of the present invention.

Referring to FIG. 5, which shows the first refractive index thin film layer 4, the second refractive index thin film layer 5, the first refractive index thin film layer 4, the second refractive index thin film layer 5, and the first refractive index thin film layer 4 successively evaporation deposited on the hardened layer 3 of the lens 2. Referring to FIG. 6 and FIG. 7, which show the indium tin oxide thin film layer 6 evaporation deposited between the first refractive index thin film layer 4 and the second refractive index thin film layer 5 and between the second refractive index thin film layer 5 and the first refractive index thin film layer 4, respectively, after which the second refractive index thin film layers 5 and the first refractive index thin film layers 4 are again respectively successively evaporation deposited thereon.

Figure 9:
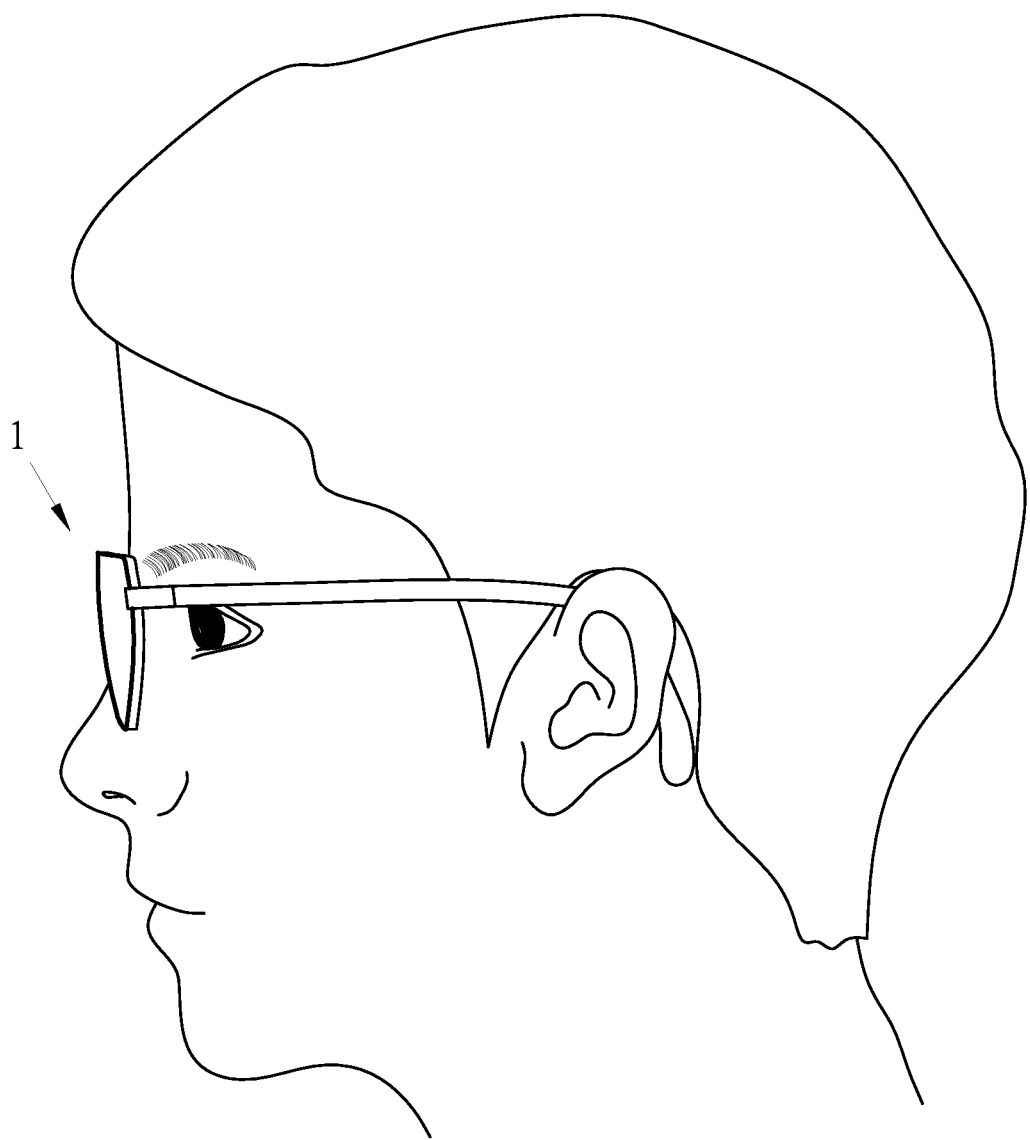
FIG. 9 is an application schematic view of the mid-infrared lenses according to the embodiment of the present invention.

Referring to FIG. 9, which shows a user wearing a spectacles frame, wherein the spectacles frame is fitted with two of the mid-infrared lens 1. The plurality of thin film layers on the lens 2 are used to provide the mid-infrared lenses 1 with the function to block harmful light, such as blue light and infrared light, and absorb reflected ultraviolet radiation, thereby protecting the user's eyes from injury.

Moreover, mid-infrared rays radiated from the lens 2 are used to assist blood circulation in the eyes to accelerate metastasis.

The mid-infrared lens 1 was sent to the Taiwan Industrial Technology Research Institute to measure the average spectral emissivity between 8 and 14 μm, wherein the measurement was based on the ASTM-E1933-99a Standard Test Methods. The measurement data result is shown in Table 1,

TABLE 1

Average spectral emissivity measurement data between 8 and 14 μm of mid-infrared lens

| Measurement Standard | Sample | Temperature ° C. | Average spectral emissivity between 8 and 14 μm |
|---|---|---|---|
| ASTM | lens | 40.3 | 0.99 |

The test lens manufactured according to the method disclosed in the present invention was formed as a spectacles lens. The test lens had a convex surface and a concave surface, wherein the convex surface was the outer surface and the concave surface was the inner surface of the above-described spectacles lens. Because a spectrometer was used to measure the reflected wavelengths, the concave surface of the test lens was blackened before measurement so as to reflect the light to the spectrometer, wherein a marker was used to blacken the concave surface. After measurement, the spectral emissivity between 8 and 14 μm of the test lens was 0.99 (99%), which proves that the manufacturing method of the mid-infrared lens of the present invention is indeed able to manufacture lens with high emissivity.

Figure 10:
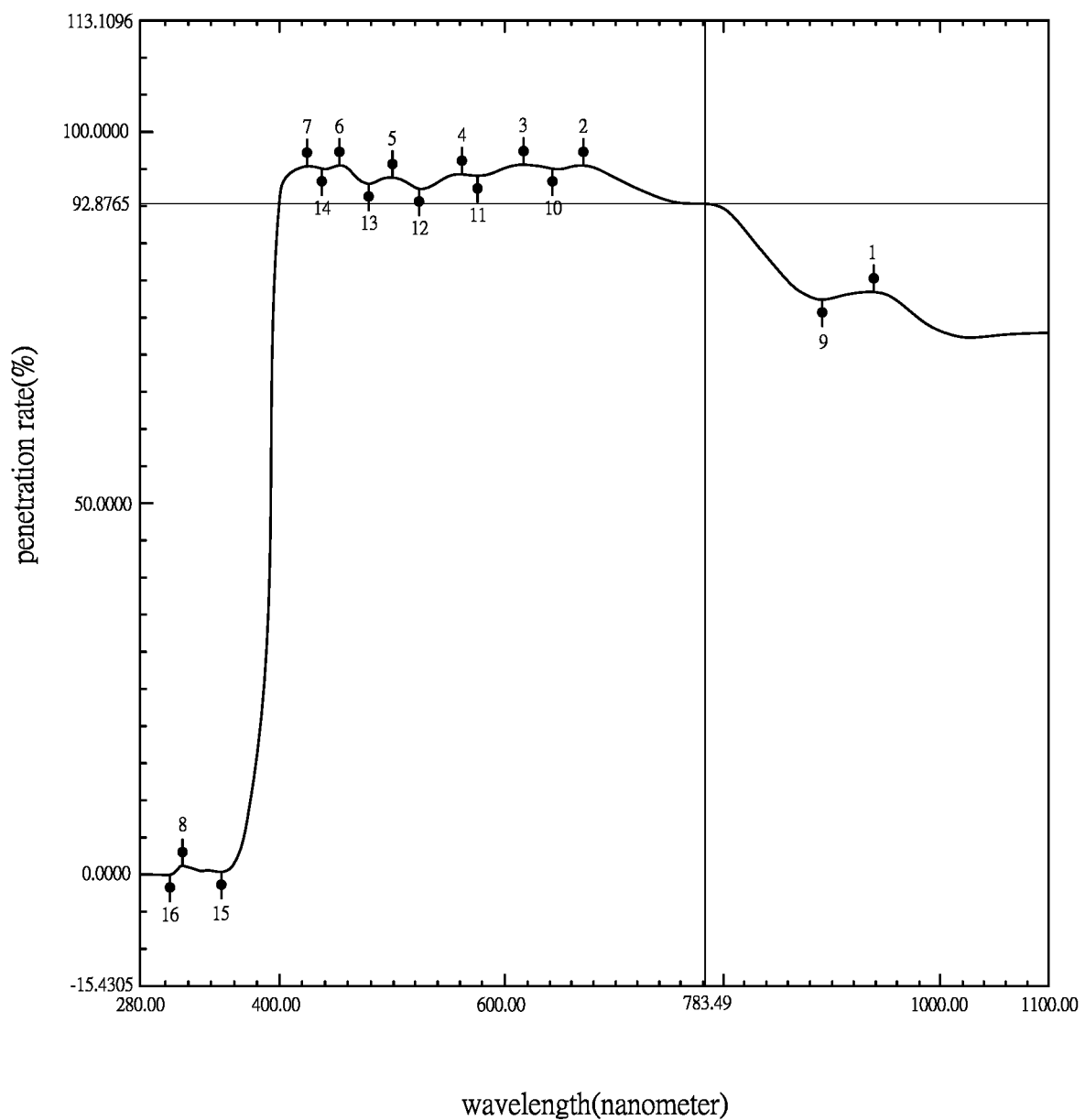
FIG. 10 is a graph showing the penetration rate of visible light through the mid-infrared lenses according to the embodiment of the present invention.

Referring to FIG. 10, an experiment on the penetration rate of visible light through a transparent mid-infrared lens of the present invention, and it was found that the penetration rate of visible light with wavelengths between 400 and 780 nanometers was above 90%, thereby proving that the mid-infrared lens of the present invention has an adequately high transparency.

In summary, operation, use, and the effectiveness achieved by application of the present invention can be clearly understood from the above description of the embodiments. However, it is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A manufacturing method for mid-infrared lens, comprising:
   placing a lens and a first far-infrared radiation source together in an operating space, and carrying out heating at a temperature between 40 and 115° C., wherein the heating time is between 1 and 3 hours, thus enabling the lens to receive far-infrared rays, and producing the lens releasing mid-infrared rays;
subsequently, immersing the lens in a hardening liquid, causing the hardening liquid to coat the lens while controlling the coating thickness to between 1 and 3 micrometers, wherein the hardening liquid is an intermixture of silicone and isopropanol or an intermixture of silicone and methanol, and adding a far-infrared material or a far-infrared composite material to the hardening liquid, wherein the far-infrared composite material is a mixture of a far-infrared material and zinc oxide (ZnO), thus prolonging a duration of time the lens releases the mid-infrared rays; and
   placing the lens coated with the hardening liquid in a drying space to dry, causing the hardening liquid to dry and harden and form a hardened layer on the surface of the lens, wherein the temperature of the drying space lies between 80 and 120° C., and the drying time is between 1 and 10 hours.

2. The manufacturing method according to claim 1, wherein the far-infrared material is any one of the chemicals listed below: magnesium oxide (MgO), calcium oxide (CaO), barium oxide (BaO), zirconium dioxide ($ZrO_2$), titanium dioxide ($TiO_2$), chromic oxide ($Cr_2O_3$), manganese dioxide ($MnO_2$), iron oxide ($Fe_2O_3$), aluminum oxide ($Al_2O_3$), a carbide, a silicide, a boride, a nitride, tantalum (Ta), molybdenum (Mo), tungsten (W), iron (Fe), nickel (Ni), platinum (Pt), copper (Cu), or gold (Au); the solid weight content of silicone in the hardening liquid lies between 19% and 35%.

3. The manufacturing method according to claim 1, wherein a progressive heating-up procedure of the lens receiving far-infrared rays from the first far-infrared radiation source gradually raises the temperature from 40 to 115° C. during a heating time of 1 to 3 hours; a stage heating procedure raises the temperature from a low temperature to a high temperature, wherein each stage of temperature rise is maintained for a period of time.

4. The manufacturing method according to claim 1, wherein a direct heating-up procedure of the lens receiving far-infrared rays from the first far-infrared radiation source directly raises the temperature from 40 to 115° C. during a heating time of 1 to 3 hours; the temperature directly rises from a low temperature to a high temperature, and the highest temperature is maintained for a period of time.

5. The manufacturing method according to claim 1, wherein a plurality of the first far-infrared radiation sources are placed in the operating space around the lens.

6. The manufacturing method according to claim 1, wherein a second far-infrared radiation source is placed in the drying space, enabling the lens to receive far infrared rays emitted by the second far-infrared radiation source during the drying process.

7. The manufacturing method according to claim 1, wherein evaporation deposition is further carried out on the hardened layer, the evaporation deposition comprises:
   evaporation depositing a first refractive index thin film layer;
evaporation depositing a second refractive index thin film layer on the first refractive index thin film layer;
   successively carrying once or a number of times the operating process involving evaporation depositing the first refractive index thin film layer and the second refractive index thin film layer; and
   finally again evaporation depositing the first refractive index thin film layer on the topmost second refractive index thin film layer;
   wherein the refractive index of the first refractive index thin film layer is lower than the refractive index of the second refractive index thin film layer.

8. The manufacturing method according to claim 7, wherein the refractive index of the first refractive index thin film layer lies between 1.46 and 1.98, and the refractive index of the second refractive index thin film layer 5 lies between 2.15 and 2.76.

9. The manufacturing method according to claim 7, wherein the first refractive index thin film layer is one of the following: a silicon oxide thin film layer, a silicon dioxide thin film layer, or a composite thin film layer of silicon oxide and silicon dioxide; the second refractive index thin film layer is one of the following: a zirconium dioxide thin film layer, a titanium dioxide thin film layer, a dititanium trioxide thin film layer, or a trititanium pentoxide thin film layer.

10. The manufacturing method according to claim 7, wherein an indium tin oxide thin film layer is further evaporation deposited between the first refractive index thin film layer and the second refractive index thin film layer.

11. The manufacturing method according to claim 7, wherein before evaporation depositing the first refractive index thin film layer and the second refractive index thin film layer on the hardened layer, the evaporation depositing target material and the first far-infrared radiation source are placed together in the operating space and heated at a temperature between 40 and 115° C.; the heating time is between 1 and 3 hours, enabling the target material to receive the far infrared rays.

12. The manufacturing method according to claim 1, wherein the weight proportion of the far-infrared material or the far-infrared composite material in the hardening liquid lies between 1% and 5%.

13. The manufacturing method according to claim 1, wherein the weight proportion of the zinc oxide (ZnO) in the far-infrared composite material lies between 20% and 40%.

* * * * *